METHOD OF ADHERING TUNGSTEN TO GLASS AND FOR PROVIDING A TUNGSTEN-GOLD INTERCONNECT LAYER

Filed May 10, 1971

INVENTOR
John Francis Osborne
Hans Joachim Pille
BY Mueller & Aichele
ATTY'S.

United States Patent Office 3,729,406
Patented Apr. 24, 1973

3,729,406

METHOD OF ADHERING TUNGSTEN TO GLASS AND FOR PROVIDING A TUNGSTEN-GOLD INTERCONNECT LAYER

John Francis Osborne, Tempe, and Hans Joachim Pille, Mesa, Ariz., assignors to Motorola, Inc., Franklin Park, Ill.

Filed May 10, 1971, Ser. No. 141,645
Int. Cl. C23c *15/00*
U.S. Cl. 204—192 4 Claims

ABSTRACT OF THE DISCLOSURE

In building semiconductor integrated circuits, it is often necessary to adhere a layer of electrically conductive connections to an insulating layer. The electrically conductive connections comprise the connections between the several circuit elements built into the integrated circuit. For many reasons, the circuit connections are of gold and the insulating layer is of $SiO_2$ (glass). However, gold does not adhere with sufficient tenacity to glass, whereby, an intermediate layer of tungsten is used between the glass and the gold. It has been found that the tungsten does not adhere sufficiently tightly to the glass in accordance with prior art processes to produce high quality integrated circuits. This poor adherence is due to the fact that the tungsten which is sputtered on the glass in an argon atmosphere contains large amounts of argon and other gases. Furthermore, the formation of tungsten oxide tends to prevent adherence of the tungsten to the glass. A method of depositing an adherent layer of tungsten on glass is disclosed in which the oxygen in the argon atmosphere is reduced below the level that causes the production of tungsten oxide and the argon entrapped in the tungsten is greatly reduced. A greatly improved method of producing a tungsten-gold circuit element interconnection layer including the so deposited tungsten is also disclosed.

BACKGROUND

Figure 1:
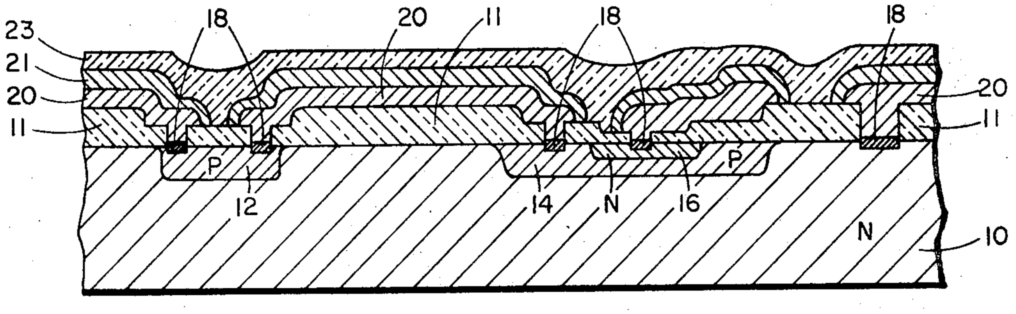

This invention relates to the method of depositing tungsten on glass in a manner such that the tungsten adheres to the glass and particularly of providing a tungsten-gold interconnect layer including such adherent layers on a semiconductive monolithic integrated circuit chip for interconnecting the circuit elements built into such a chip.

In the production of monolithic integrated circuit chips, several elements are produced in the surface layer of the chip. These elements comprise resistors, diodes, bipolar NPN or PNP transistors or insulated gate field effect transistors of the N- or P-channel type, as examples. The several elements, when completed, are properly connected together to provide such circuit components as flip-flop circuits, AND or OR transmission gate circuits, or memory circuits, to name but a few. Then the circuit components are connected together to provide a functional circuit and the circuit terminals are connected to external terminals or to pads on the chip. All the connections that do not cross, are usually made in a single layer. That is, a layer of insulation, usually glass is provided either during the construction of the elements of the chip or in a later step, over the exposed surface of the chip that contains the several circuit elements therein. Holes are provided in the glass layer to permit making connections to the elements. Conductors are applied to the surface of the glass, as is necessary, to provide all the connections that it is convenient to make that do not cross. Then, a second layer of insulation, again usually glass, is put on the first layer of conductors. Holes are made in the second layer of glass to permit connections to points on the first layer of connections as needed. Then a second layer of conductors are applied to the second layer of glass, this second layer of conductors crossing the first layer as is necessary but being insulated therefrom by the second layer of glass. This process is repeated as often as the circuit design requires. The top layer of glass is passivating glass and holes are made therein for the purpose of making connections to external connections of the chip.

Each layer, insulation or conducting, as applied to the chip or to a lower layer, should adhere to the chip or to the lower layer to produce a device which will withstand further steps such as testing and applying further layers. These further steps often involve high temperature treatment. The chip (which includes all layers applied to the substrate) must withstand the handling and temperatures that it undergoes during the processing thereof and also during the use thereof. Furthermore, the materials are so chosen and the process steps are such that the final structure is stable with time and use thereof, that is, the integrated circuit has a reasonable life span. It is known that semiconductive chips including aluminum conductors in the conductive layers thereof, are not stable with the passage of time in that the aluminum degrades. It has been suggested that gold be used as the material of the interconnecting conductive layer because of gold's high stability. However, gold does not adhere to glass whereby a gold interconnect layer deposited directly on a glass insulating layer is impractical. An intermediate layer of a conductor or intermediate layers of conductors are used between the glass insulation layer and the gold interconnecting conducting layer. Furthermore, one or more intermediate layers are used between the gold conducting layer and the glass insulation layer that is deposited thereon. In each case, the intermediate layer provides adhesion between the glass and the gold or between the gold and the glass as the case may be. Plural intermediate layers involve extra material, extra bulk and particularly extra steps of preparation which adds to the cost of the finished chip. A satisfactory single intermediate layer is therefore desirable.

It is an object of this invention to provide an improved method of adhering gold to glass.

It is a further object of this invention to provide an improved method of adhering gold to glass utilizing only a single intermediate layer.

It is another object to provide a tungsten-glass interconnect layer for interconnecting the circuit elements provided on a chip.

SUMMARY

According to this invention, a single intermediate layer of tungsten is provided for bonding gold to glass. The tungsten is sputtered onto the surface of the glass in an inert atmosphere, usually argon. A certain amount of oxygen is unavoidably present in the argon atmosphere, whereby a small amount of tungsten oxide is formed and is deposited on the glass. This tungsten oxide does not adhere to the glass and furthermore it tends to prevent pure tungsten from adhering to the glass. According to this invention, the concentration of the oxygen in the argon is reduced to the point where so little oxygen is left in the argon atmosphere that substantially no tungsten oxide is formed. This is done by reducing the pressure of the gases in the chamber to below $10^{-5}$ torr and then filling the space with pure argon.

Addition the excess argon over about 1% entrapped in the tungsten while it is being sputtered and while it is in the argon atomsphere prevents the tungsten from adhering to this glass. The amount of entrapped argon in the tungsten is a function of one or more of four parameters. These parameters are the power level applied to the tungsten target, the substrate temperature during the sputtering of the tungsten, the gas pressure in the chamber where the tungsten deposition takes place, and the spacing between the tungsten target and the substrates in the chamber. The power level is the power, measured in watts, provided to the body of the tungsten target, which is usually disk shaped, in the processes of sputtering. This power is provided by subjecting the tungsten to a negative bias with respect to the substrates in a known manner as by applying RF power thereto. For improved adherence of the tungsten to glass, about 150 watts of power is applied to a tungsten target which has a flat disk-shaped face surface, facing the substrates, of about five inches in diameter. The power is proportionally varied for other sizes of the target and amounts to about two watts per square inch. As for the temperature of the substrates, this temperature is raised from room temperature to 300° C. before sputtering and is kept at that temperature as nearly as is possible during sputtering. In accordance with the prior art, the substrates are at room temperature when sputtering is started and the sputtering process heats the substrates. Furthermore, the argon gas pressure, which is about five microns of mercury according to the prior art, is raised to about ten microns of mercury. The anode to cathode spacing, that is the distance between the target to the substrates, which according to the prior art has been anywhere from an inch and a half to eighteen inches, is set at about four inches. It is not known how these parameter changes reduces the amount of argon entrapped in the tungsten as applied to the glass, but it is thought that this reduction is due to the fact that the greatly energetic bumping of tungsten atoms in the argon atmosphere against argon atoms may cause the entrapment of argon atoms in the tungsten. This bumping may be reduced by the low energy, compared to the prior art, applied to the tungsten. However, it is known that the adherence of the tungsten to the glass is increased if the entrapment of argon in the tungsten is reduced.

Further in accordance with this invention, after the adherent tungsten layer is applied to the glass, gold is deposited on the tungsten in any known manner, adding its conductivity to the tungsten. Then, the parts of the gold-tungsten layer that are not required are etched away using known etching processes. A tungsten-gold interconnect layer is thereby provided on the glass layer. If another layer of conductors is required, a glass layer is deposited on the gold layer using any known methods. Holes are made in the glass as required for permitting making of connections to the first tungsten-gold interconnect layer. Another tungsten-gold interconnect layer of connections is applied to the second layer of glass in the manner disclosed above. This process is repeated as required. The chip is then completed in any known manner.

DESCRIPTION

Figure 2:
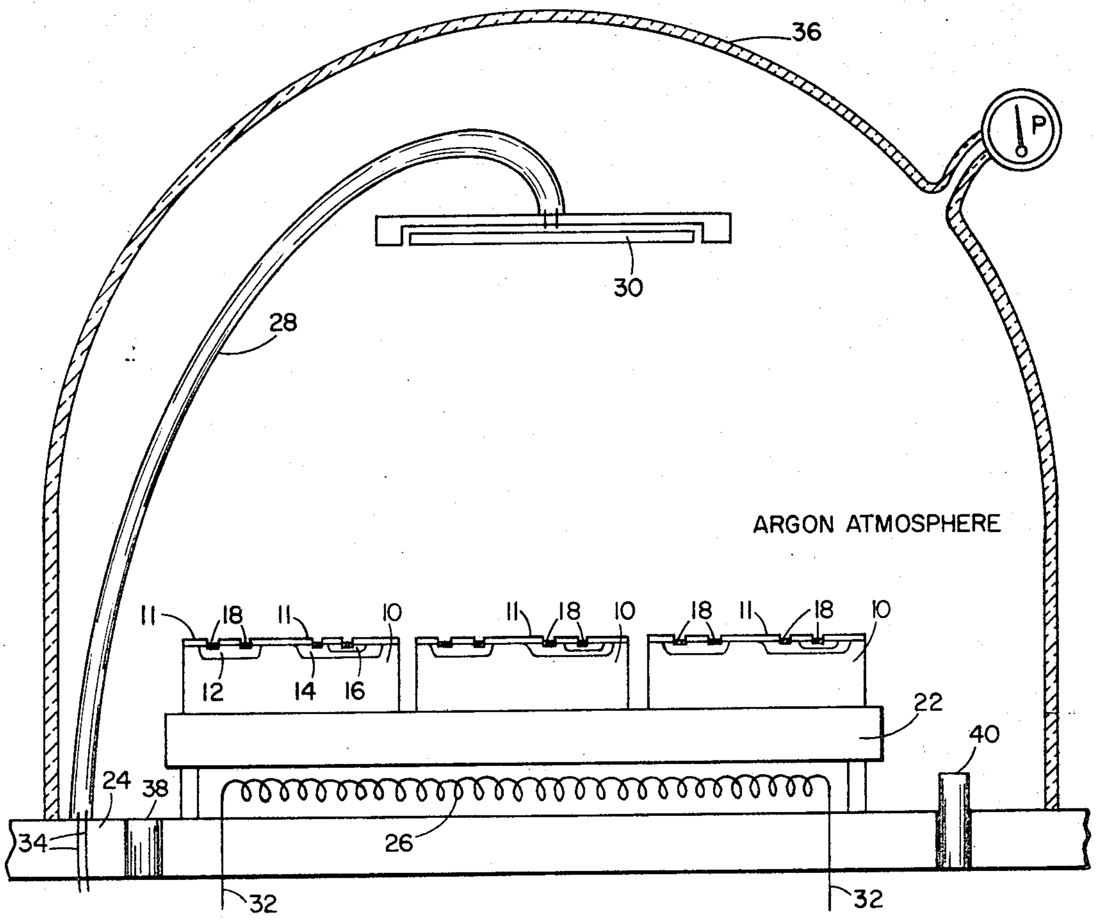

The invention will be better understood upon reading the following description in connection with the accompanying drawing in which FIG. 1 illustrates a substrate on which several layers including a tungsten layer have been applied and FIG. 2 illustrates the method of applying a tungsten layer to a substrate in accordance with this invention.

Turning first to FIG. 1, a monocrystalline semi-conductive substrate or chip 10 of N-type conductivity is provided and a P-region 12 which may be a resistor and another P-region 14, which may be a base of a bi-polar transistor is diffused into the upper surface of the substrate 10. An N-region 16 is diffused into the P-region 14 providing the emitter of an NPN transistor whose collector is the N portion of the substrate 10. In the known process of providing the different areas 12, 14 and 16 and in producing the holes through an insulating layer 11 of $SiO_2$ or glass, to make contacts therethrough to the resistor 12 and to the emitter 16, the collector 10 and the base 14, the insulation layer 11 takes the shape such as that shown. Then in a known manner, platinum silicide regions 18 are formed in the exposed portions of the substrate as shown for making low resistance electrical contacts thereto in the bottom of their respective holes. Then, in accordance with this invention, tungsten in deposited on the $SiO_2$ layer 11 and in the several holes for making contact with the platinum silicide 18. As shown, for example, one of the connections 20 to the resistor 12 is connected to the base 14 of the transistor including the elements 10, 14 and 16. The manner in which this is done is explained in connection with FIG. 2.

Several substrates 10 are put on a support 22. Three substrates are shown in FIG. 2, however the number thereof may be much greater. The chips or substrates 10 are in the condition where glass layer 11 is present as shown, the diffusions 12, 14 and 16 are made in the substrate 10 and the platinum silicide contacts are provided. However, the tungsten 20 (as well as the layers 21 and 23 above the tungsten 20) has not yet been deposited thereon. The support 22 is positioned on a table 24 and a heater 26 is provided under the support 22. A support 28 supports a piece or target of tungsten 30, which is usually of disk shape, over the center of the support 22 and about four inches from the upper surface of the substrates 10. A flat surface of the disk-like target 30 faces the substrates 10. Electrical wires 32 supply heating current for the heater 26. Electrical wires 34 which are attached to the end of the tungsten 30 in a desired manner, supply sputtering power to the tungsten target 30. If desired, sputtering power may be applied to the tungsten target 30 by the application thereof of a radio frequency filed by known means not shown. A bell jar 36, preferably of quartz, is placed over the support 22 and the substrates 10 on it and also over the support 28 which supports the target 30. The bell jar 36 is sealed to the table 24. The bell jar 36 is evacuated to a pressure of below $10^{-5}$ torr by way of an opening 38 in the table 24 to which the jar is sealed. The inlet pipe 40 is sealed during this evacuation. The evacuation to this low pressure removes so much oxygen from the chamber 36 as to make the tungsten oxide deposit in a later step in the method to be described of so little amount that the tungsten oxide will not interfere with the adhering of the tungsten 20 to the glass 11. Then, the bell jar 36 is filled with argon by way of a tube or pipe 40 to a pressure of about 10 microns of mercury, the pressure used in the prior art being about 5 microns. The range of pressures of argon gas may be from 5 to 10 microns of mercury with little difference in the quality of the deposited tungsten resulting. Then electricity is fed the heater 26 to heat the substrates 10, to about 300° C., the prior art temperature being room temperature before sputtering starts.

Then the tungsten target 30 is heated to sputtering temperature by application of radio frequency energy to it at about 2000 volts and at about 13.56 megahertz. The energy is reduced to about 150 watts when the disk-like target 30 has a diameter of about five inches. According to the prior art, the supplied energy is at about the same frequency but is at a power of about 400 watts for the same diameter target. It is thought that the application of the reduced power according to this invention causes less energetic motion of the tungsten atoms through the argon atmosphere to the substrates whereby the tungsten absorbs less argon. The tungsten may be biased by a radiation of radio frequency energy thereto instead of by the direct conduction as shown. Furthermore, the distance from the tungsten mass or target 30 to the substrates 10 is about four inches. The prior art distance is from 1½ inches to 18 inches, although four inches is used.

Having deposited the tungsten layer 20 in the manner above described herein, the chips are removed from the chamber 36 and a gold layer 21 is deposited on the tungsten layer 20 in any known manner as by sputtering. The gold and tungsten are removed from where they are not wanted, in a known manner as by etching to provide the desired tungsten-gold interconnect layer. If only one interconnect layer is required, passivation glass 23 is provided on the exposed upper surface of the chip and holes (not shown) are made through the passivation glass 23 to permit connections to the terminals of the chip. If, however, a further interconnect layer is required, a glass insulation layer, not shown, is applied to the upper surface of the chip. Then tungsten connections are provided on the upper glass insulating surface in the manner here described. Then gold is put on the tungsten in a known manner. In this manner as many tungsten-gold interconnect layers as is needed are provided. If desired, the glass is deposited directly on the gold in a manner disclosed in an application by the inventors of this application, Ser. No. 139,051, filing date Apr. 30, 1971, and assigned to the assignee of this application.

The resultant chip has one or more tungsten-gold interconnect layers thereon, as required by the design of the chip that are chemically and physically compatible with each other. The several layers including the interconnecting layers adhere tightly to each other, they have long term thermal, physical, mechanical, and chemical stability and have high conductivity. Yet only a single intermediate layer of tungsten is required between the glass and the gold conductive layer to provide the tungsten-gold interconnect layers.

What is claimed is:

1. The method of depositing tungsten on a dielectric material which comprises:

placing a substrate having a dielectric surface on which tungsten is to be deposited and a target of tungsten in a space;

bringing the pressure in said space below $10^{-5}$ torr and then filling said space with argon at a pressure of from 5 to 10 microns of mercury, whereby the oxygen concentration in said space is greatly reduced;

heating said substrate in said space to about 300° C.;

applying sputtering power to said target, said sputtering power being about 2 watts per square inch of the surface of the target which faces said dielectric surface; and the distance between said target and said dielectric surface being about 4 inches.

2. The method as recited in claim 1 wherein said dielectric surface is a glass.

3. The method as recited in claim 2 wherein said sputtering power is radio frequency energy at about 2000 volts and 13.56 mHz.

4. The method of providing a tungsten-gold interconnect layer on the surface of a substrate having a dielectric layer thereon which comprises:

placing said substrate and a tungsten target which is to be sputtered in a space;

minimizing the oxygen concentration in said space by reducing the pressure to below $10^{-5}$ torr and filling said space with argon to a pressure of about 10 microns of mercury;

heating said substrate to about 300° C.;

applying sputtering power to said target, said sputtering power being about 2 watts per square inch of the surface of the target which faces said dielectric surface;

the distance between said target and said dielectric surface being about 4 inches whereby tungsten is deposited on said dielectric surface;

depositing gold on said tungsten; and so etching said deposited tungsten and gold as to provide a tungsten-gold interconnect layer.

References Cited

UNITED STATES PATENTS

| | | | |
|---|---|---|---|
| 3,653,999 | 4/1972 | Fuller | 204—192 |
| 3,437,888 | 4/1969 | Hall | 204—192 |
| 3,641,402 | 2/1972 | Revitz | 204—192 |
| 3,510,728 | 5/1970 | Tolliver | 317—101 |
| 3,341,753 | 9/1967 | Cunningham | 317—234 |

JOHN H. MACK, Primary Examiner

S. S. KANTER, Assistant Examiner

U.S. Cl. X.R.

317—234 N